(12) United States Patent
Kamath et al.

(10) Patent No.: US 6,569,739 B1
(45) Date of Patent: May 27, 2003

(54) METHOD OF REDUCING THE EFFECT OF IMPLANTATION DAMAGE TO SHALLOW TRENCH ISOLATION REGIONS DURING THE FORMATION OF VARIABLE THICKNESS GATE LAYERS

(75) Inventors: Arvind Kamath, Mountain View, CA (US); Venkatesh P. Gopinath, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/216,425

(22) Filed: Aug. 8, 2002

(51) Int. Cl.[7] .................... H01L 21/336; H01L 21/8222
(52) U.S. Cl. ..................... 438/270; 438/271; 438/330; 438/332
(58) Field of Search ................... 438/270, 271; 257/330, 332

(56) References Cited

U.S. PATENT DOCUMENTS 6,090,716 A * 7/2000 Floyd et al.

2002/0109182 A1 * 8/2002 Lee et al.

* cited by examiner

Primary Examiner—John F. Niebling
Assistant Examiner—Stanetta Isaac
(74) Attorney, Agent, or Firm—Beyer, Weaver & Thomas, LLP

(57) ABSTRACT

Embodiments of the invention include a method for blanket ion implanting a semiconductor substrate surface to induce uniform damage over desired portions of the surface thereby reducing non-uniform etch effects caused by the varying etch rates of surface materials and conditions during surface cleaning. The invention includes providing a semiconductor substrate having gate oxide regions and a sacrificial oxide layer of a predetermined thickness formed thereon. The surface of the substrate is pattern masked to reveal openings in the gate oxide regions and ion implanted through the openings in the pattern mask to form gate oxide regions. The pattern mask is removed from the substrate and a blanket implantation of the sacrificial oxide layer is performed. The substrate is then cleaned to remove the sacrificial oxide layer leaving the substrate in readiness for further processing.

25 Claims, 4 Drawing Sheets

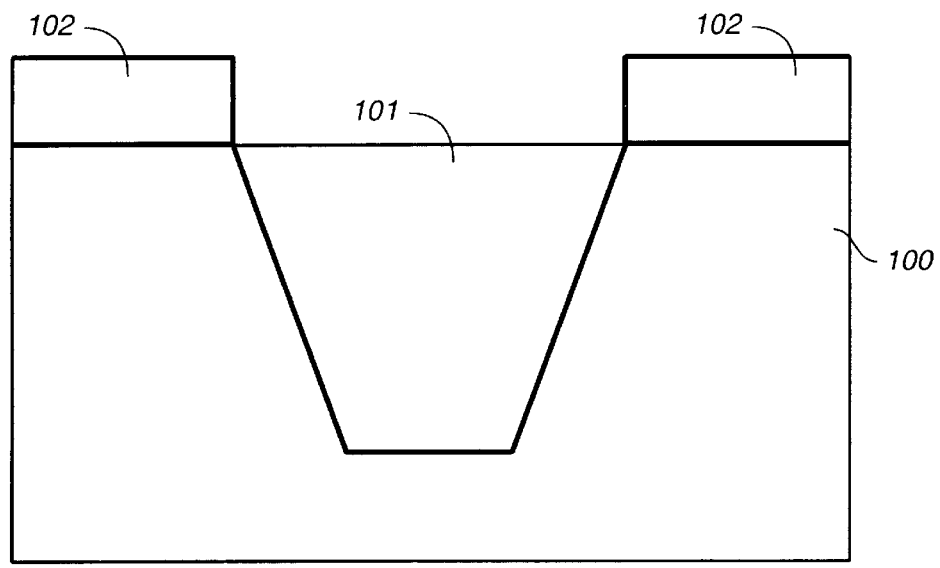
FIG._1
*(PRIOR ART)*
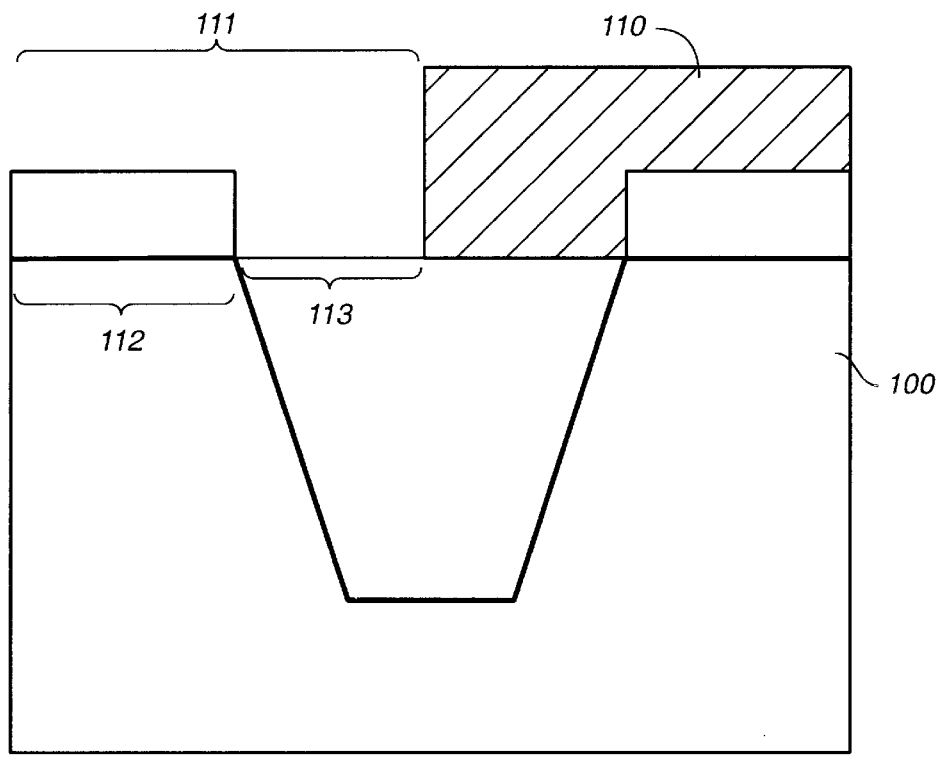
FIG._2
*(PRIOR ART)*

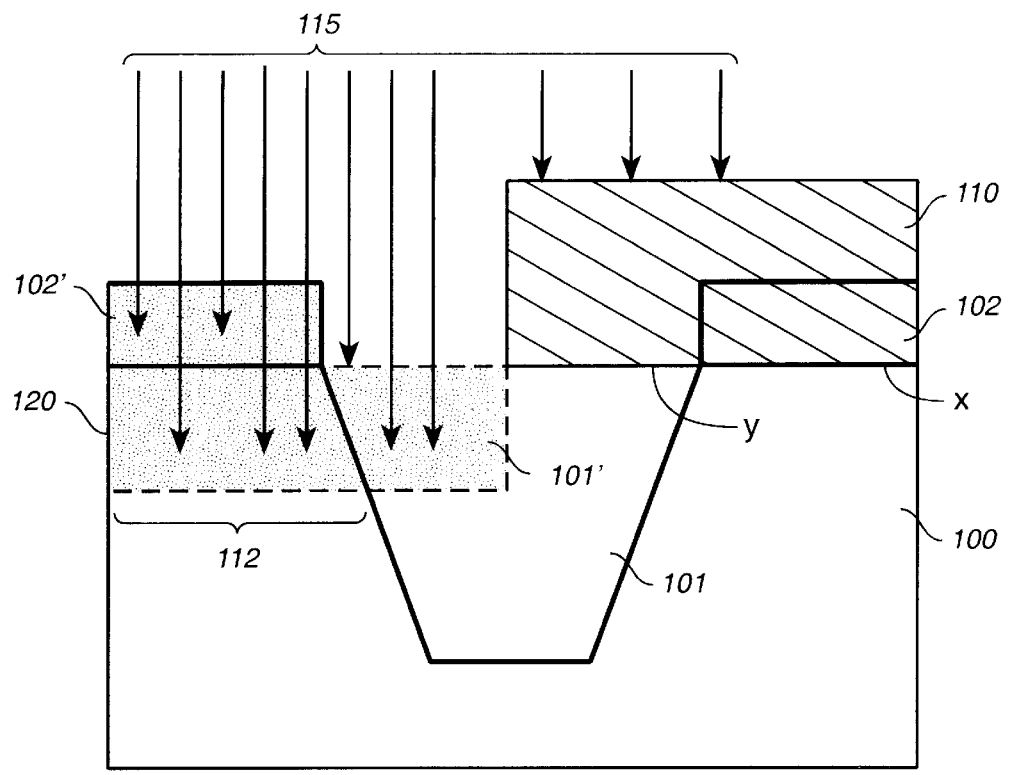
FIG._3
(PRIOR ART)
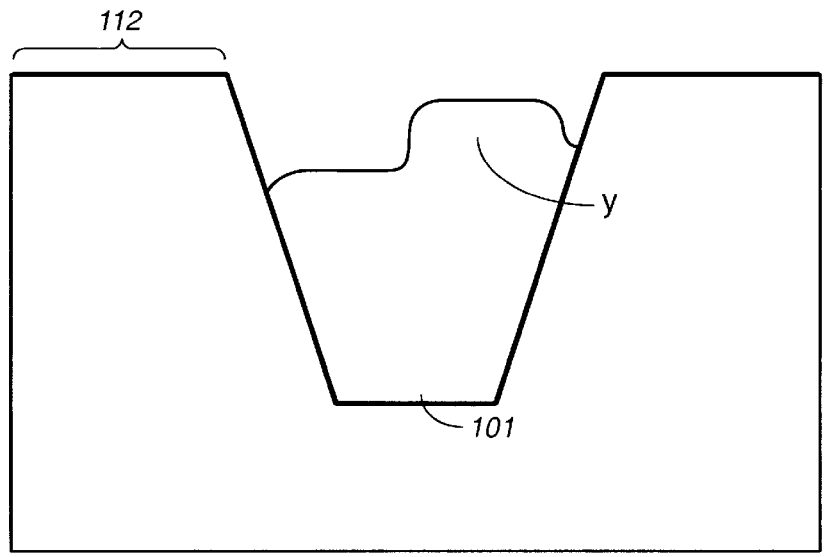
FIG._4
(PRIOR ART)

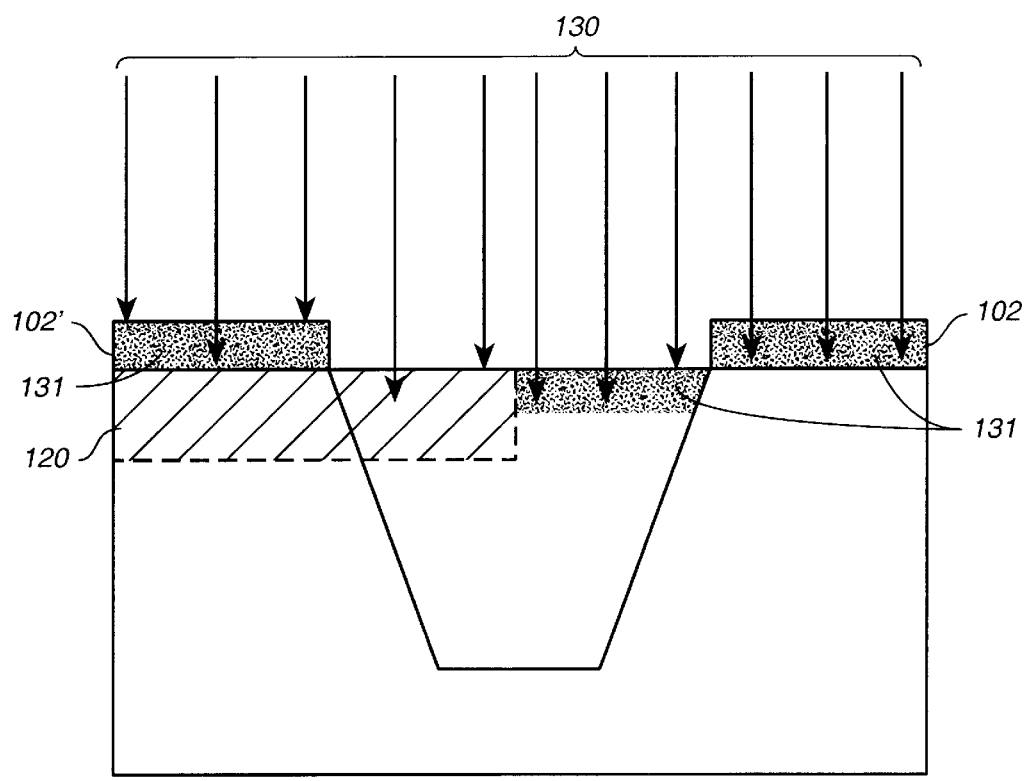
FIG._5
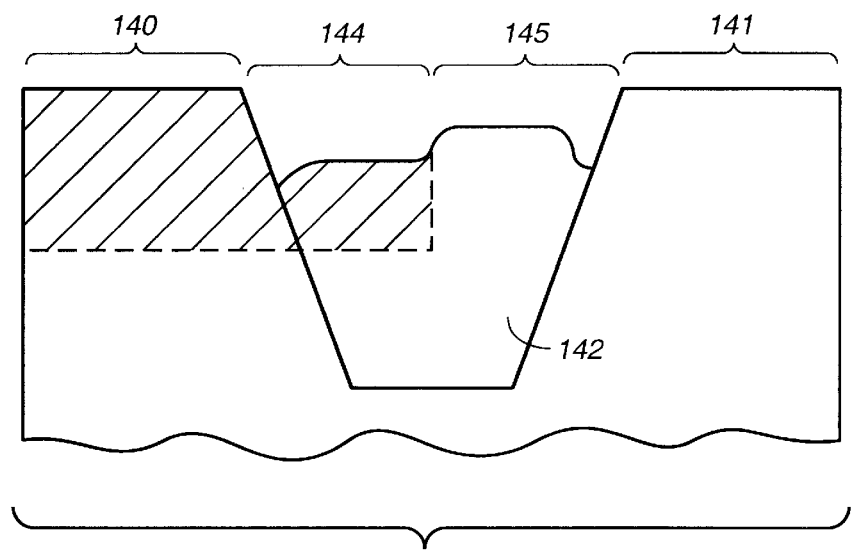
FIG._6

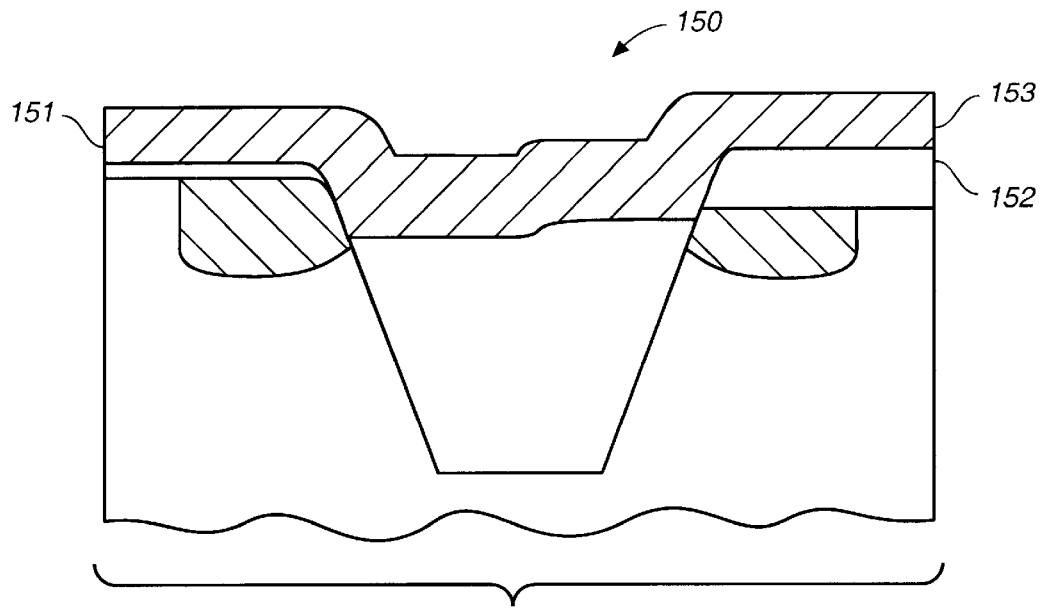
FIG._7
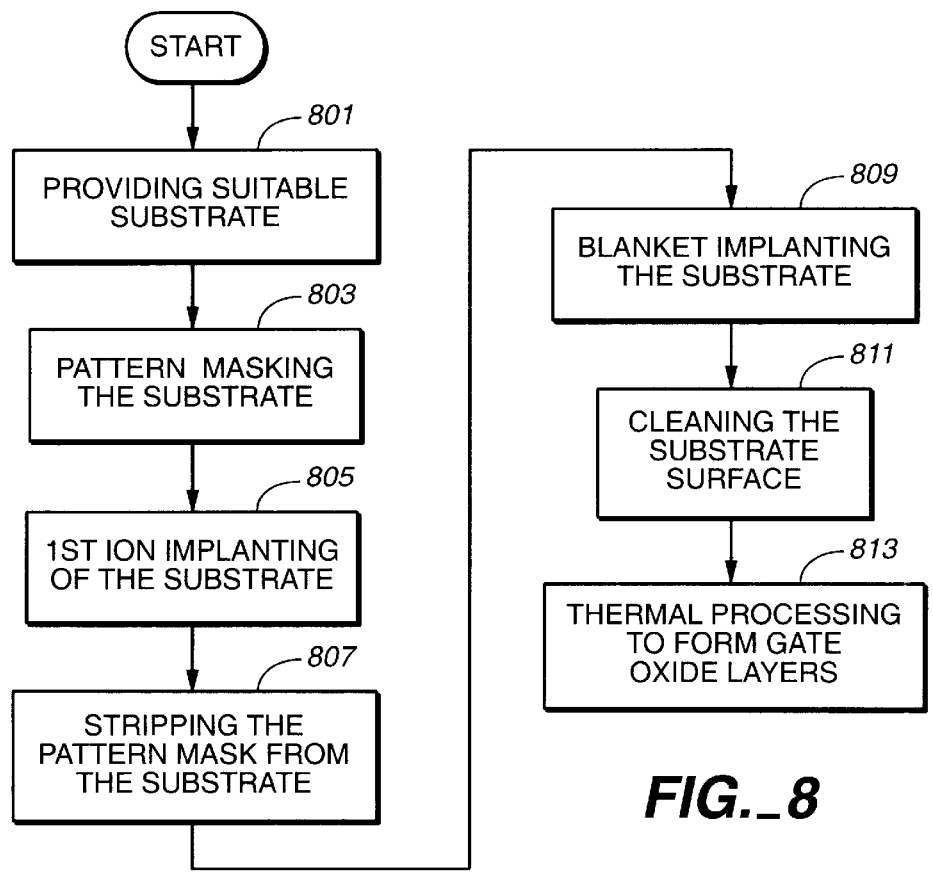
FIG._8

METHOD OF REDUCING THE EFFECT OF IMPLANTATION DAMAGE TO SHALLOW TRENCH ISOLATION REGIONS DURING THE FORMATION OF VARIABLE THICKNESS GATE LAYERS

TECHNICAL FIELD

The invention described herein relates generally to semiconductor devices and processing. In particular, the invention relates to methods of semiconductor processing that can be used to form variable thickness gates without inducing excessive damage in shallow trench isolation (STI) regions of a semiconductor surface.

BACKGROUND

The semiconductor industry uses a number of different methods to construct CMOS circuit devices on semiconductor surfaces. In some architectures, it is beneficial to form gate layers having several different thicknesses. One approach is described as a "growetch-grow" (GEG) process which is used to create gate layers having different thicknesses. Such GEG processes require numerous masking and etching steps. Consequently, these processes are very time intensive. Additionally, GEG processes require numerous surface cleaning steps that can seriously erode the semiconductor surface.

In other embodiments, gate layers can be formed having different thicknesses simultaneously. This is commonly accomplished by treating the different gate regions of the semiconductor surface with a range of active materials. The type and dose of the implanted active materials can be used to either retard or accelerate oxide formation in the various gate regions, thereby facilitating the formation of gate oxide layers having differing thicknesses.

FIGS. 1–4 illustrate a conventional approach for such simultaneous gate formation. In FIG. 1 a semiconductor substrate 100 is provided. Such a substrate can be formed of a variety of semiconductor materials including, but not limited to, silicon and doped silicon. The substrate 100 is formed in a configuration suitable for having integrated circuit (IC) structures formed thereon. In the depicted embodiment, the substrate 100 is provided having a pattern of shallow trench isolation (STI) structures 101 formed thereon. The pattern of STI structures 101 is configured such that IC devices (e.g., CMOS structures or other semiconductor electronic devices) can be formed on the substrate 100.

Commonly, STI structures 101 are formed by etching isolation trenches in the substrate surface and the depositing silicon dioxide ($SiO_2$) to complete the isolation structure 101. Additionally, the surface of the substrate is provided with a "sacrificial oxide" layer 102 which protects the underlying substrate surface. Commonly, the sacrificial oxide layer 102 is formed by thermally oxidizing the silicon of the substrate 100 to form a $SiO_2$ sacrificial oxide layer 102. Typically, the sacrificial oxide layer 102 is formed to a thickness of about 100–150 Å thick.

FIG. 2 depicts a next step, wherein the substrate 100 is masked with a photoresist layer 110. Typically, the photoresist layer 110 includes a pattern of openings 111 that correspond to an underlying gate oxide region 112. The photoresist layer 110 masks portions of the substrate 100. The opening 111 formed in the photoresist layer 110 includes some degree of error tolerance to account for misalignments during processing. As a result, portions 113 of the STI structure 101 are not covered by the photoresist layer 110 and are exposed to subsequent process steps.

FIG. 3 depicts the continuation of the foregoing conventional process. The substrate surface is then implanted with ions 115. In the regions covered with the photoresist layer 110 (like regions x and y), the implanted ions are blocked. Whereas, in the regions defined by openings, the ions 115 penetrate into an ion implantation region 120 (indicated with the dashed line). The ion implantation region 120 includes exposed portions of the sacrificial oxide layer 102, the substrate 100, and trench 101 (identified herein as the now implanted regions of the sacrificial oxide layer 102' and trench 101'). The purpose of such ion implantation is to change the oxidation properties of the silicon regions 112 (also referred to as gate oxide regions, where the gate oxide layers will be grown. By carefully and controllably dosing the substrate with appropriate implantation material (or not), many different thicknesses of gate oxide layers can be formed simultaneously during a subsequent thermal oxidation process. For example, implantation with nitrogen retards the subsequent rate of oxide formation in the substrate. Conversely, implantation with fluorine accelerates the rate of oxide formation. Thus, under the same thermal oxidation conditions and process times, $SiO_2$ layers of different thickness can be formed on the same substrate. The advantages of such a process are numerous and obvious.

Unfortunately, one of the drawbacks of this process is that the implantation process that introduces active materials into the gate oxide region 112 also implants other regions of the surface. As previously indicated, the sacrificial oxide layer 102' and trench 101' are also implanted. Such implantation results in significant damage to the indicated portions of the sacrificial oxide layer 102' and the trench 101'. The importance of this damage is discussed in the following paragraphs.

In order to create the gate oxide layer in the gate oxide region 112, the substrate 100 must be thermally processed in an oxidation furnace. However, to accomplish oxidation, the photoresist layer 110 and the sacrificial oxide layer 102 are commonly removed from the surface. Thus, the photoresist layer 110 is removed and the sacrificial oxide layer 102, 102' is also removed. Therein lies one of the shortcomings of existing processes. Commonly, the sacrificial oxide layer 102 is removed using a cleaning process that involves immersion and rinsing in an etch bath formed of HF and de-ionized water (DI).

Because the sacrificial oxide layer 102' and trench 101' have been damaged by the implantation process, they etch at a significantly higher etch rate than the unimplanted portions of the surface (such as region y).

FIG. 4 shows the results of a typical HF surface cleaning process after the surface has been subjected to conventional ion implantation. Because of the damage caused in the implantation region 120, the implanted portions of the isolation trench 101' and the implanted portions of the sacrificial oxide layer 102' are eroded more rapidly than the unimplanted portions of the surface (such as the unimplanted sacrificial oxide layer 102 and the unimplanted trench region y). Consequently, the implanted portions of the surface (e.g., 101', 102') have etch rates on the order of three to four times the etch rates of the unimplanted regions (such as y and 102). This presents certain difficulties because the entire unimplanted sacrificial oxide layer 102 must be removed. The amount of cleaning (etching) time required to remove unimplanted sacrificial oxide layer 102 is much greater than that required for the implanted regions. Thus, as the unimplanted sacrificial oxide layer 102 is removed, substantial amounts of material are removed from the implanted regions (e.g., 101', 102'). In fact, for each given amount of material removed from the undamaged sacrificial oxide layer 102, three to four times as much implanted material is removed. The implanted material in the trench 101' is etched at a much faster rate than the adjacent unimplanted material y. As a result, extremely uneven etch profiles similar to that depicted in FIG. 4 are created during cleaning. In a typical example, using a 30:1 DI:HF cleaning solution, when 100 Å of a sacrificial oxide layer 102 is removed, about 300–400 Å of implanted grown $SiO_2$ material 101' and about 120 Å of unimplanted grown $SiO_2$ material 101 is removed from the isolation trench. This non-uniform etch profile in the isolation trench results in a number of electrical defects that can result in circuit failure in the fabricated electronic circuitry.

Many other approaches have been tried to reduce the level of material removed from the trench. In one example, the aforementioned GEG processes are used. But, as is known to those having ordinary skill in the art, such processes require many additional process steps and suffer from excessive surface erosion. Another approach is to reduce the exposure to HF cleaning solutions. This entails, among other things, a significant reduction in sacrificial oxide thickness. Unfortunately, this can result in reduced gate quality and increased defect density. For these and other reasons, an improved process resulting in less damage to layers of the semiconductor surface is desired.

SUMMARY

In accordance with the principles of the present invention, a method of blanket ion implanting a semiconductor substrate surface to induce uniform damage over selected portions of the surface thereby reducing non-uniform etch effects caused by the varying etch rates of surface materials and conditions during surface cleaning is disclosed.

Embodiments of the invention include a method for removing sacrificial oxide layers from a semiconductor substrate surface. The method includes providing a semiconductor substrate having gate oxide regions and a sacrificial oxide layer of a predetermined thickness formed thereon. The surface of the substrate is pattern masked to reveal openings in the gate oxide regions and ion implanted through the openings in the pattern mask to form gate oxide regions. The pattern mask is removed from the substrate and a blanket implantation of the sacrificial oxide layer is performed. The substrate is cleaned to remove the sacrificial oxide layer and the substrate is left in readiness for further processing. In another related embodiment, the blanket ion implantation is performed prior to pattern masking.

Another embodiment of the invention comprises a method for forming gate layers on a semiconductor substrate surface. A semiconductor substrate suitable for forming electronic circuitry thereon is provided. The substrate includes gate regions and a sacrificial oxide layer of a predetermined thickness formed thereon. The substrate is masked with a pattern mask that includes openings in the gate regions. High energy ions are implanted into the gate regions through the openings in the pattern mask. The pattern mask is removed from the substrate and a low energy blanket ion implantation of the surface is conducted. The substrate is cleaned to remove the sacrificial oxide layer and gate oxide layers are then formed in the gate oxide regions. The substrate is now in readiness for further processing as needed.

These and other aspects of the present invention are described in the detailed description of the embodiments set forth hereinbelow.

BRIEF DESCRIPTION OF THE DRAWINGS

The following detailed description can be more readily understood in conjunction with the accompanying drawings, in which:

FIGS. 1–4 are simplified schematic cross-sectional views of a portion of a semiconductor substrate surface having a conventional gate oxide implantation processes performed thereon.

FIG. 1 is a simplified schematic cross-sectional view of a portion of a semiconductor substrate surface in readiness for pattern masking.

FIG. 2 depicts the surface of FIG. 1 after pattern masking.

FIG. 3 depicts the surface of FIG. 2 during high energy ion implantation.

FIG. 4 depicts the surface of FIG. 3 after the mask is stripped and the surface is cleaned.

FIGS. 5–7 are simplified schematic cross-sectional views of a portion of a semiconductor substrate surface depicting a portion of a gate oxide formation process embodiment in accordance with the principles of the present invention.

FIG. 5 depicts the surface of FIG. 3 after the mask is stripped and the surface is blanket ion implanted in accordance with an embodiment of the present invention.

FIG. 6 depicts the surface of FIG. 5 after the surface is cleaned in accordance with an embodiment of the present invention.

FIG. 7 depicts the surface of FIG. 6 after the thermal oxidation and gate formation and subsequent gate electrode formation in accordance with an embodiment of the present invention.

FIG. 8 is a flow diagram illustrating one embodiment of a process for forming gate oxide layers in accordance with the principles of the present invention.

It is to be understood that, in the drawings, like reference numerals designate like structural elements. Also, it is understood that the depictions in the Figures are not necessarily to scale.

DETAILED DESCRIPTION OF THE DRAWINGS

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following detailed description describes various embodiments of implantation and semiconductor surface cleaning methods designed to reduce erosion of isolation structures during gate formation processes in accordance with the principles of the present invention. Prior art approaches have generally focused on the need to reduce substrate exposure to ion implantation in order to preserve the surface. At its heart, the embodiments of the present invention take exactly the opposite approach. The present embodiments increase the amount of ion implantation. In effect, the principles of the present invention use the damage caused by ion implantation to reduce the overall amount of damage caused to the substrate surface. These and other principles of the invention will be explained hereinbelow.

A process embodiment of the present invention can make use of the substrates described in FIGS. 1, 2, and 3. As described, such a substrate can be formed of a variety of semiconductor materials, including but not limited to, silicon and doped silicon. The substrate 100 is configured so that integrated circuit (IC) structures can be formed thereon. In the present invention, the substrate 100 includes a pattern of electrical isolation structures formed thereon. In the depicted embodiment, the electrical isolation structures comprise shallow trench isolation (STI) structures 101 formed using conventional fabrication processes. In one example, such STI structures 101 can be formed by etching isolation trenches into the substrate surface and then depositing silicon dioxide ($SiO_2$) to complete the isolation structure 101. Other electrically insulating materials can be used in place of $SiO_2$. Additionally, many other types of field oxide layers or isolation structures known to those having ordinary skill in the art can be used to form the suitable isolation structures. The pattern of STI structures 101 is configured such that IC devices (e.g., CMOS structures or other semiconductor electronic devices) can be formed on the substrate 100.

As depicted in FIGS. 1 and 2, the surface of the substrate is provided with a "sacrificial oxide" layer 102 that protects the underlying substrate surface. The sacrificial oxide layer 102 is preferably formed by thermally oxidizing the silicon of the substrate 100 to form a $SiO_2$ sacrificial oxide layer 102. Typically, the sacrificial oxide layer 102 is formed at about 30 Å to about 300 Å thick. In one preferred implementation, the sacrificial oxide layer 102 is formed at about 60 Å thick. The inventors contemplate embodiments using thinner layers of sacrificial oxide. Such embodiments will be discussed hereinbelow.

As discussed previously, various areas of the surface are pattern masked to define gate oxide regions. One such implementation has been discussed with respect to FIG. 2 which uses a photoresist mask layer 110 to pattern mask the surface and define openings for gate oxide formation. Once the photoresist mask layer is in place, the surface is treated with an ion implanter. The exposed regions (e.g., gate regions) are implanted at desired doses with carefully selected ions (the dose and ion selection depending on the desired final thickness of the resulting gate oxide). Typically, the implantation used for gate oxide formation has a relatively high energy. In this context, "high energy" is defined as implantation energies sufficient to implant ions through an overlying sacrificial oxide layer 102 and into the underlying substrate 100 to a depth sufficient to permit gate oxide formation during subsequent thermal oxidation processes. Commonly, this requires ion implantation to depths in the range of 100 Å to about 1000 Å, preferably about 300 Å. Of course, as is known to those having ordinary skill in the art, such energies are also dependent on the implanted ion species. In a typical example, high energy implantation of nitrogen or fluorine ions uses implantation energies in the range of about 1–50 keV, preferably about 25 keV. In one embodiment, nitrogen implantation at 5–50 keV will implant nitrogen ions (and induce damage in the substrate) to depths of about 550 Å.

Once high energy implantation is complete, the pattern mask (e.g. photoresist layer 110) can removed (stripped). New pattern masks can be applied to define different gate regions where different gate oxide thicknesses are desired. The new pattern mask can be subjected to additional implantation using different ions and different doses to form other gate regions. In this way, a plurality of different gate regions can be formed, each capable of having gate oxides with different thicknesses being formed thereon. This process of pattern masking, ion implanting, and stripping the pattern mask is repeated until a desired implantation pattern is formed. Such a pattern will yield a desired pattern of gate oxides having the desired thicknesses after appropriate processing (e.g., thermal oxidation).

At this point in the previously described conventional processes, a hydrogen fluoride (HF) cleaning process is used to remove the sacrificial oxide layer and then the substrate is processed in a furnace to create the gate oxides. However, as explained, one of the difficulties in existing processes is the damage caused to the isolation regions during cleaning. For example, if a 60 Å thick sacrificial oxide layer is cleaned, the resulting cleaning process would etch off 180–300 Å of damaged material from the isolation region 101'. This is an unacceptably large amount of material to be removed from an isolation structure.

The present invention minimizes the foregoing problem by adding an additional low energy blanket implantation step. This step can be implemented at any time during which the entire desired portion of the substrate surface is exposed. Such blanket implantation can be implemented either before the pattern mask is applied or after the pattern mask is stripped exposing the entire desired portion of the surface. FIG. 5 depicts one embodiment of such a process. In the depicted embodiment, the surface has been already implanted with a relatively high energy ion implantation process resulting in a damaged substrate in the ion implantation region 120 (the area bounded by the dashed line). Such a process is depicted and explained with respect to FIG. 3.

With continued reference to FIG. 5, after such high energy (first) implantation, the pattern mask is removed from desired portions of the surface. The entire exposed surface is then treated with a low energy (second) blanket ion implantation 130 process. In one embodiment, the implantation energy used in the blanket ion implantation 130 process is adjusted such that the energy is sufficient to implant ions into the sacrificial oxide layer 102 without penetrating into the underlying substrate. As a result, the entire exposed surface is implanted to a shallow depth. In particular, the undamaged sacrificial oxide layer 102 is now implanted and damaged (as depicted by the dotted section) to a shallow depth. In the depicted embodiment, the second ion implantation damages the sacrificial oxide layer 102 throughout its entire thickness. Thus, the undamaged sacrificial oxide layer 102 is damaged to the same depth as the previously damaged sacrificial oxide layer 102'. It is worth noting that the inventors contemplate that in some embodiments, the sacrificial oxide layer 102 can be damaged to intermediate depths that leave some regions of the sacrificial oxide layer 102 undamaged. However, in most embodiments, the low energy blanket implantation is conducted so that all desired sacrificial oxide layers are damaged to the same depth.

As a result of the blanket ion implantation process, both sacrificial layers (102 and 102') are now damaged. The areas damaged by the blanket implantation step are depicted by the dotted regions 131. As can be seen in the depicted embodiment, the depth of the damage in the previously undamaged sacrificial oxide layer 102 is now approximately the same as that in the (previously implanted) sacrificial oxide layer 102'. As a result, the sacrificial oxide layers now have approximately the same etch rates. This is different than for conventional processes wherein the damaged sacrificial oxide layers have much higher etch rates than that of the undamaged sacrificial oxide layers.

Because the two sacrificial oxide layers 102, 102' now have about the same amount of damage, they both have about the same accelerated etch rates. This avoids the long clean times previously required to remove the undamaged sacrificial oxide layers. As a consequence of the now shortened cleaning times, less damage is caused to the material in the isolation trenches (or other isolation structures) by the HF cleaning steps. Additionally, the entire surface of the isolation region now has a damaged surface 131. During cleaning, this will serve to induce more even erosion in the isolation region during cleaning.

The following illustrates an embodiment that can be used to treat sacrificial oxide layers having a wide range of thicknesses. In this example, the blanket ion implantation process is used to treat a substrate having a 60 Å sacrificial oxide layer formed thereon. Nitrogen can be selected as the implantation ion. Nitrogen is useful because it retards oxidation formation and its silicon implantation properties are well understood. Using nitrogen, a dose of $3.5 \times 10^{14}$ ions/cm$^2$ and an implantation energy in the range of about 0.1–3.0 keV can be used. Preferably, an implantation energy of about 1.2 keV will result in the implantation of the sacrificial oxide layer to a depth of about 60 Å. This will enable the entire 60 Å thick sacrificial oxide layer to be damaged, without significantly damaging the underlying material.

Of course, as is known to those having ordinary skill in the art, many thicknesses for sacrificial oxide layers can be used. Such thicknesses commonly range from about 30–120 Å thick. Naturally, such variation in oxide thickness will require adjustments to the blanket implantation energies to accommodate the different sacrificial oxide layer thicknesses. For thicker sacrificial oxide layers, the depth of the implantation damage is increased. Thus, greater implantation energies are needed. The adjustment of such energies are well known to those having ordinary skill in the art and are based on the type and thickness of the layer being implanted as well as the implantation material. The implantation energies of the blanket ion implantation step can also be varied so that the implanted ions do not fully penetrate the sacrificial oxide layer. In some process environments, such flexibility is desirable. One of the benefits of the lower energy used in the blanket implantation is that the damage caused by such implantation does not penetrate as deeply into the substrate as higher energy implantations, thereby limiting the damage depth to less than the already existing damage. As for suitable implantation materials, in addition to nitrogen, a wide range of other implantation materials can be employed. Examples of such materials include, but are not limited to, oxygen, fluorine, and argon, as well as numerous other materials. As is well known to those having ordinary skill in the art, other process parameters can also be adjusted.

FIG. 6 shows the substrate depicted in FIG. 5, after a pre-gate cleaning step is used to remove the sacrificial oxide layers 102, 102'. The sacrificial oxide layers 102, 102' are removed from the substrate in regions 140 and 141 respectively. Due to the shortened cleaning times, the amount of material removed from the trench region 142 is considerably lessened. This is highlighted with the following example. An embodiment having a sacrificial oxide layer of about 60 Å thick is treated with a blanket ion implantation with nitrogen at about 1.2 keV. A subseqent HF cleaning removes only about 90 Å of SiO$_2$ from the trench 142. In contrast, if the blanket ion implantation had not been performed, it would have taken longer to remove the unimplanted sacrificial oxide layer, thereby subjecting the trench region 142 to a longer etch time, removing 300 Å of SiO$_2$ from the trench 142. Moreover, because the blanket implantation created a shallow damage region across the entire trench, the surface of the trench 142 now maintains a flatter surface profile (e.g., compare with the contour of FIG. 4). In other words, a first portion 144 of the trench surface that was exposed to the first ion implantation step and a second portion 145 of the trench surface that was not exposed to the first ion implantation step are more evenly affected by the HF clean step, thereby yielding a flatter trench surface than is demonstrated in the existing processes.

Once the surface is cleaned, the substrate is subjected to further processing. For example, such further processing can include a gate formation process. Commonly, this can be accomplished by heating the substrate in an oxidation furnace. This will result in the formation of a number of different gates in accordance with the implantation patterns formed in the substrate. Subsequently, the substrate can be subjected to further processing in accordance with other semiconductor processing steps. One representative example is depicted in FIG. 7. The depicted semiconductor structure 150 has been treated in an oxidation furnace to form a thinner gate oxide layer 151 (e.g., about 30 Å thick) and a thicker gate oxide layer 152 (e.g., about 90 Å thick) formed on the substrate depicted in FIG. 6. A gate electrode 153 (e.g., formed of polysilicon) is then subsequently formed over the gate oxide layers 151, 152 in further processing steps.

Additionally, further masking can be conducted and different gate regions can be defined. Added gate structures can be formed in the new gate regions. Moreover, the new gate regions can use different types of gate materials, for example, high-K gate materials. Examples of such materials include, without limitation, HfO$_2$, Al$_2$O$_3$, and other similar materials. Subsequently, further conventional semiconductor processing can be used to form semiconductor structures.

A method embodiment for forming gate layers on a semiconductor substrate surface is briefly described in conjunction with the flow diagram of FIG. 8. The method includes providing a semiconductor substrate suitable for forming electronic circuitry thereon (Step 801). Typically such substrates include gate regions and sacrificial oxide layers. The surface of the substrate is masked with a pattern mask that includes openings in the gate regions (Step 803). The gate regions are then implanted using implanting ions that pass through the openings in the pattern mask (Step 805). The pattern mask is removed from the substrate (Step 807). The substrate surface (including the sacrificial oxide layer) is then blanketed with low energy ions in a blanket ion implantation (Step 809). The substrate surface is then cleaned to remove the sacrificial oxide layer after the blanket implantation has been performed (Step 811). The substrate now stands in readiness for further processing (Step 813). Such further processing can include thermally oxidizing the implanted gate regions to form gate oxide layers thereon. Also, such further steps can include the formation of other layers that are patterned and formed on top of the underlying substrate. These and many other processing steps can be implemented using substrates subjected to processing in accordance with the principles of the present invention.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated that low energy blanket ion implantation steps used on substrate surfaces having a wide range of sacrificial oxide layer thicknesses and can be accomplished using a wide range of implantation materials, doses, and implantation energies to accomplish the principles of the present invention. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for removing sacrificial oxide layers from a semiconductor substrate surface, the method comprising:

providing a semiconductor substrate having gate oxide regions and a sacrificial oxide layer of a predetermined thickness formed thereon;

masking the substrate with a pattern mask that includes openings in the gate oxide regions;

performing a gate oxide implantation of the gate oxide regions by implanting ions through the openings in the pattern mask;

removing the pattern mask from the substrate;

damaging the sacrificial oxide layer by performing a blanket implantation of the sacrificial oxide layer;

cleaning the substrate to remove the sacrificial oxide layer after the blanket implantation has been performed; and conducting further processing.

2. The method of claim 1, wherein conducting further processing includes forming gate oxide layers in the gate oxide regions.

3. The method of claim 2, wherein conducting further processing includes additional masking of the substrate with an additional pattern mask that includes openings that define other gate regions and forming additional gates.

4. The method of claim 3, wherein forming additional gates comprises depositing high-K gate materials.

5. The method of claim 2, wherein damaging the sacrificial oxide layer by performing the blanket implantation of the substrate comprises implanting the substrate surface with ions having an implantation energy sufficient to damage the sacrificial oxide layer without damaging portions of the substrate that underlie the sacrificial oxide layer.

6. The method of claim 5, wherein cleaning the substrate to remove the sacrificial oxide layer comprises cleaning the substrate for a period of time sufficient to remove the damaged sacrificial oxide layer.

7. The method of claim 5, wherein cleaning the substrate to remove the sacrificial oxide layer comprises cleaning the substrate for a period of time sufficient to remove the damaged sacrificial oxide layer without removing portions of the substrate that underlie the sacrificial oxide layer.

8. The method of claim 2, wherein the predetermined thickness for the sacrificial oxide layer ranges from about 30 Ångstroms (Å) to about 120 Å.

9. The method of claim 8, wherein damaging the sacrificial oxide layer by performing the blanket implantation of the substrate comprises implanting the substrate with an implantation energy sufficient to implant ions into the sacrificial oxide layer without damaging portions of the substrate that underlie the sacrificial oxide layer.

10. A method for forming gate layers on a semiconductor substrate surface, the method comprising:

providing a semiconductor substrate suitable for forming electronic circuitry thereon, the substrate having gate regions and a sacrificial oxide layer of a predetermined thickness formed thereon;

masking the substrate with a pattern mask that includes openings in the gate regions;

performing a high energy ion implantation of the gate regions by implanting ions through the openings in the pattern mask;

removing the pattern mask from the substrate;

damaging the sacrificial oxide layer by performing a low energy blanket ion implantation of the substrate and the sacrificial oxide layer;

cleaning the substrate to remove the sacrificial oxide layer after the blanket implantation has been performed;

thermally oxidizing the implanted gate regions to form gate oxide layers thereon; and conducting further processing as needed.

11. The method of claim 10 wherein performing the high energy ion implantation of the gate regions comprises implanting ions into the substrate using an implantation energy such that the implanted ions can penetrate into the substrate to a depth wherein gate oxide formation can occur during the thermal oxidation process; and wherein damaging the sacrificial oxide layer by performing the low energy blanket ion implantation of the substrate and sacrificial oxide layer comprises implanting ions into the substrate and into the sacrificial oxide layer using an implantation energy such that the ions can penetrate into the sacrificial oxide layer without penetrating into an underlying portion of the substrate thereby increasing the etch rate of the sacrificial oxide layer when exposed to a cleaning process.

12. The method of claim 11 wherein performing the high energy ion implantation of the gate regions comprises implanting ions into the substrate to a depth in the range of about 100 Ångstroms (Å) to about 1000 Å.

13. The method of claim 11 wherein performing the high energy ion implantation of the gate regions comprises implanting ions using an implantation energy in the range of about 5 keV to about 50 keV.

14. The method of claim 13 wherein performing the high energy ion implantation of the gate regions comprises implanting ions using an implantation energy of about 25 keV.

15. The method of claim 11 wherein performing the high energy ion implantation of the gate regions comprises implanting ions into the substrate selected from the group of ions consisting of nitrogen ions, oxygen ions, and fluorine ions.

16. The method of claim 11 wherein damaging the sacrificial oxide layer by performing the low energy blanket ion implantation of the substrate and sacrificial oxide layer comprises implanting ions using an implantation energy that is adjusted depending on the thickness of the sacrificial oxide layer and the choice of implantation ion.

17. The method of claim 11 wherein damaging the sacrificial oxide layer by performing the low energy blanket ion implantation of the substrate and sacrificial oxide layer comprises implanting ions using an implantation energy in the range of about 0.1 keV to about 3.0 keV.

18. The method of claim 17 wherein damaging the sacrificial oxide layer by performing the low energy blanket ion implantation comprises implanting ions using an implantation energy of about 1.2 keV.

19. The method of claim 11 wherein damaging the sacrificial oxide layer by performing the low energy blanket ion implantation of the substrate and sacrificial oxide layer comprises implanting ions selected from the group of ions consisting of nitrogen ions, oxygen ions, and fluorine ions.

20. The method of claim 19 wherein damaging the sacrificial oxide layer by performing the low energy blanket ion implantation of the substrate and sacrificial oxide layer comprises implanting nitrogen ions.

21. The method of claim 10 wherein the step of performing the high energy ion implantation is performed prior to the step of wherein damaging the sacrificial oxide layer by performing the low energy blanket ion implantation.

22. A method for removing sacrificial oxide layers from a semiconductor substrate surface, the method comprising:
   providing a semiconductor substrate having gate oxide regions, isolation structures, and a sacrificial oxide layer of a predetermined thickness formed thereon;
   damaging the sacrificial oxide layer by blanket ion implantation of the sacrificial oxide layer; and
   cleaning the substrate to remove the sacrificial oxide layer after the blanket implantation has been performed.

23. The method of claim 22 wherein damaging the sacrificial oxide layer is achieved by blanket ion implantation of the sacrificial oxide layer with implanting ions using an implantation energy in the range of about 0.1 keV to about 3.0 keV.

24. The method of claim 22 wherein damaging the sacrificial oxide layer is achieved by blanket ion implantation of the sacrificial oxide layer using an implantation energy that is adjusted depending on the thickness of the sacrificial oxide layer and the choice of implantation ion.

25. The method of claim 22 wherein damaging the sacrificial oxide layer is achieved by blanket ion implantation of the sacrificial oxide layer with implanting ions selected from the group of ions consisting of nitrogen ions, oxygen ions, and fluorine ions.

* * * * *